(12) United States Patent
Lenz

(10) Patent No.: US 7,498,963 B2
(45) Date of Patent: Mar. 3, 2009

(54) METHOD FOR GENERATING A MODULATOR INPUT SIGNAL AND PREMODULATOR

(75) Inventor: Helmut Lenz, Oberasbach (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 11/784,047

(22) Filed: Apr. 5, 2007

(65) Prior Publication Data

US 2007/0262892 A1 Nov. 15, 2007

(30) Foreign Application Priority Data

Apr. 13, 2006 (DE) .................. 10 2006 017 520

(51) Int. Cl.
*H03M 1/00* (2006.01)
(52) U.S. Cl. ..................... 341/131; 341/144
(58) Field of Classification Search ......... 341/125–160; 330/10
See application file for complete search history.

(56) References Cited

U.S. PATENT DOCUMENTS 5,577,136 A * 11/1996 Tanioka et al. .............. 382/270

| | | | |
|---|---|---|---|
| 6,018,553 A * | 1/2000 | Sanielevici et al. | 375/334 |
| 6,573,666 B1 * | 6/2003 | Killat | 341/143 |
| 6,671,329 B1 * | 12/2003 | Lenz | 330/10 |
| 6,671,330 B1 | 12/2003 | Lenz | |

FOREIGN PATENT DOCUMENTS

| | | |
|---|---|---|
| DE | 198 57 524 A1 | 6/2000 |
| DE | 198 57 525 A1 | 6/2000 |
| DE | 103 53 965 A1 | 6/2005 |
| EP | 1 193 867 A2 | 4/2002 |

OTHER PUBLICATIONS

German Office Action for DE 10 2006 017 520.4-35 dated Dec. 19, 2006 and English translation.

* cited by examiner

*Primary Examiner*—Lam T Mai
(74) *Attorney, Agent, or Firm*—Brinks Hofer Gilson & Lione

(57) ABSTRACT

A method for generating at least one modulator input signal from at least one regulator signal is provided. The method comprising: generating at least one dither signal based on the periodic output of elements of a discrete dither sequence of the basic form $DF=0, 1, 2 \ldots 2^{(m-n)}-1$; and adding the at least one dither signal to the regulator signal. The regulator signal comprises a digital regulator signal with a length of m bits, and the modulator input signal comprises a digital modulator input signal with a length of n bits, where $m>n$.

29 Claims, 11 Drawing Sheets

FIG 4
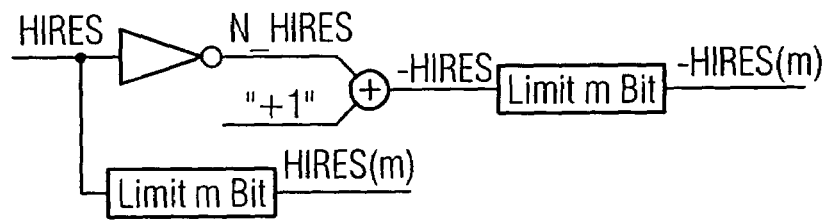
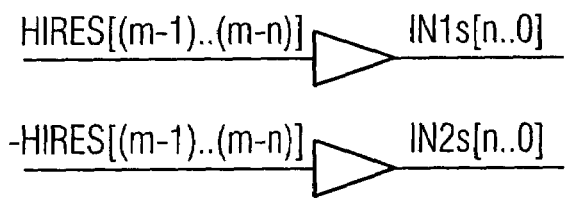
FIG 5
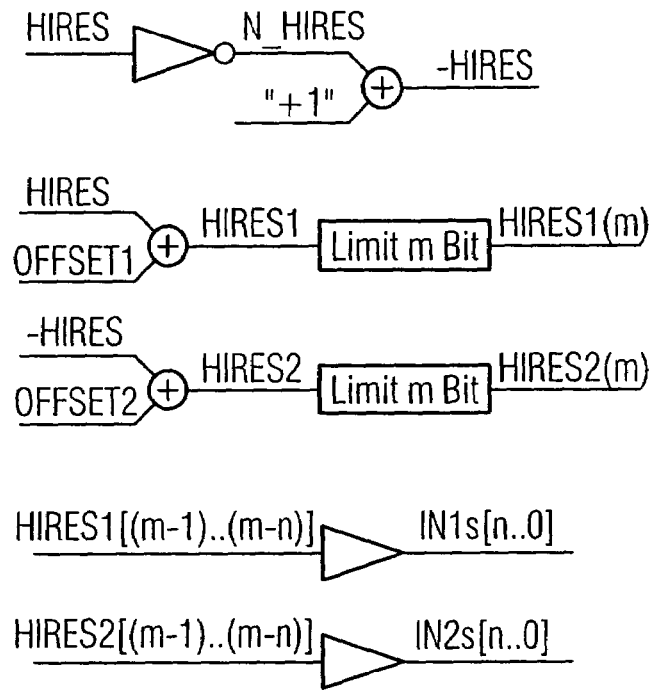

FIG 6
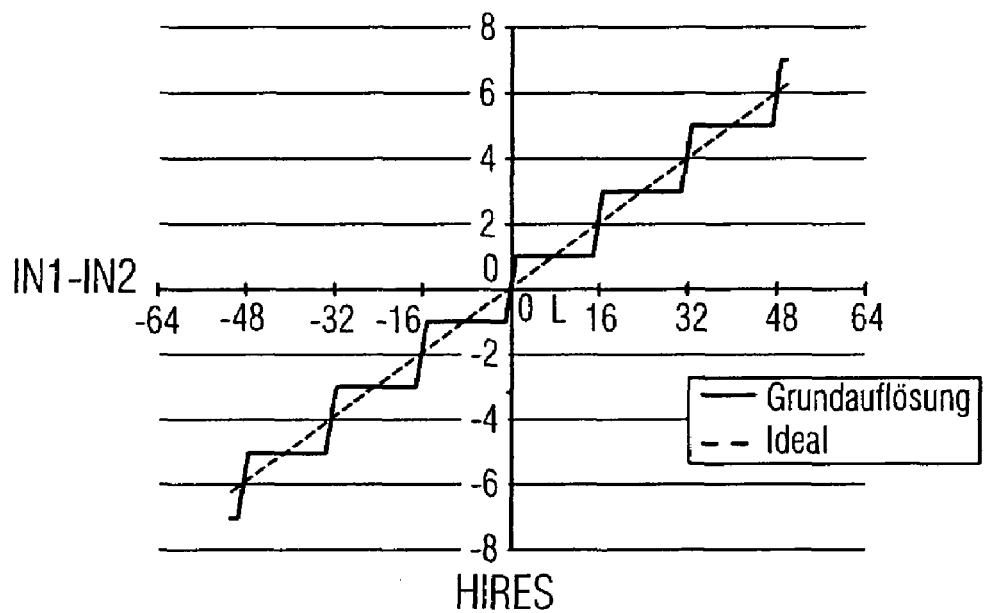

FIG 8
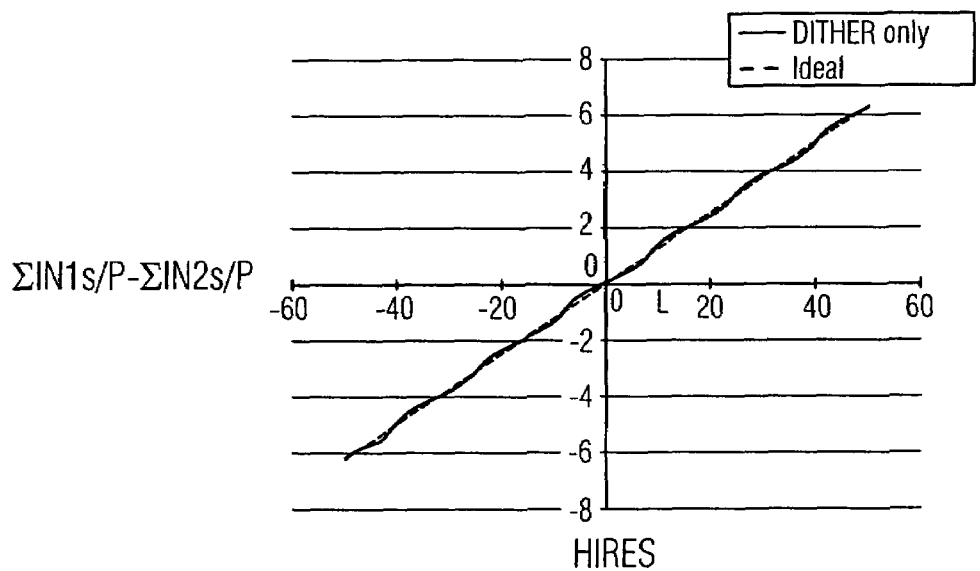
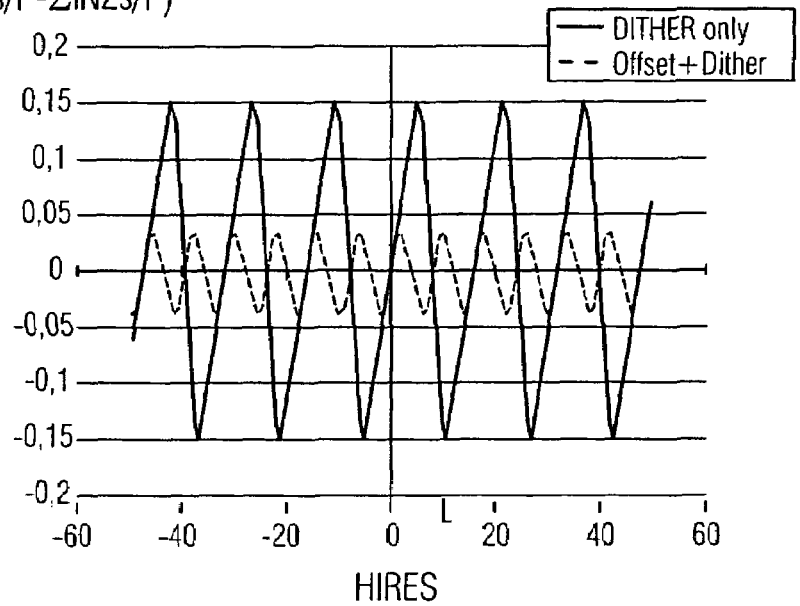

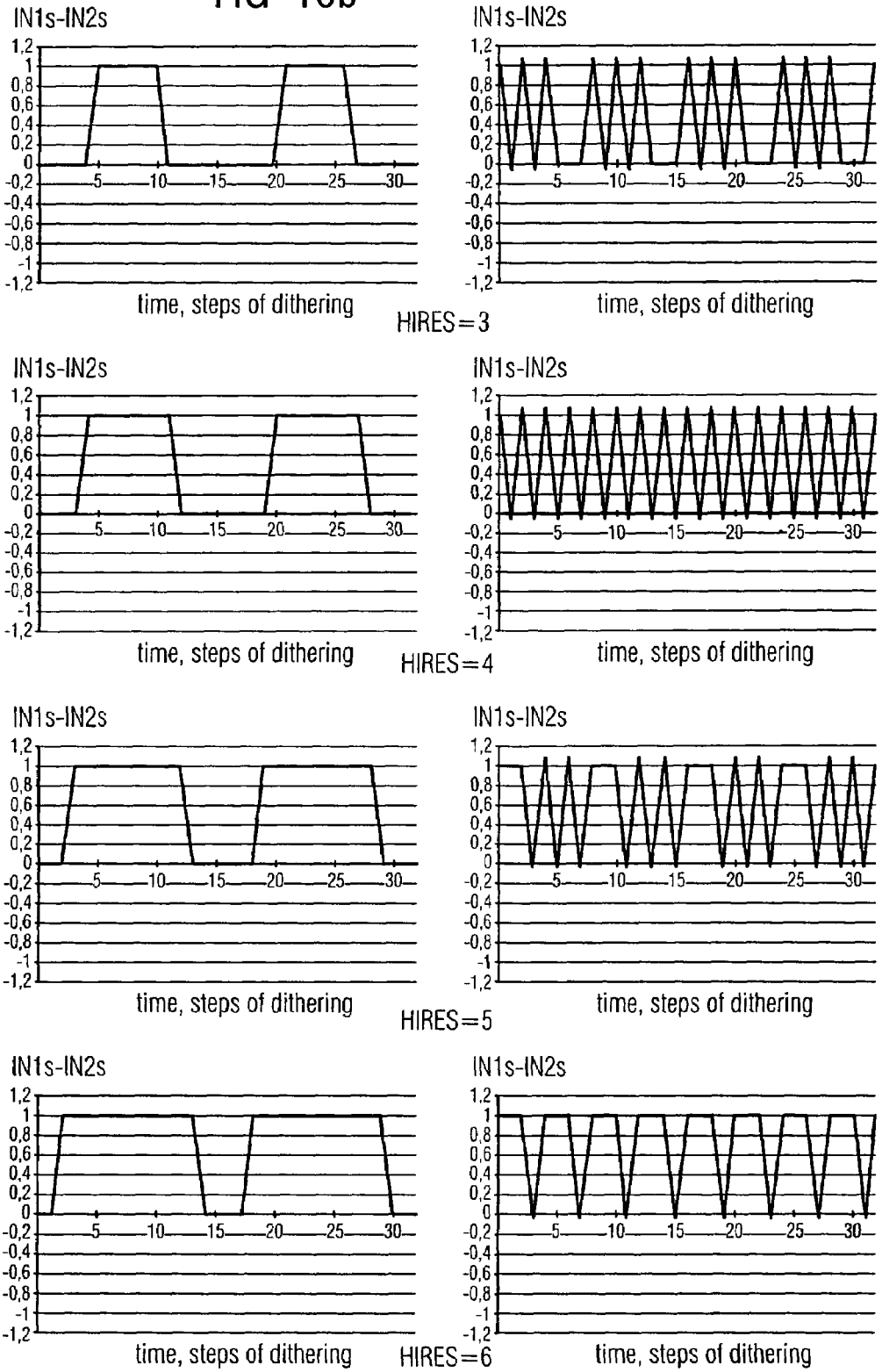

METHOD FOR GENERATING A MODULATOR INPUT SIGNAL AND PREMODULATOR

This patent document also claims the benefit of DE 10 2006 017 520.4, filed Apr. 13, 2006, which is also hereby incorporated by reference.

BACKGROUND

The present embodiments relate to a method for generating a modulator input signal and a premodulator.

DE 19857524 A1 discloses a premodulator. The premodulator includes a power amplifier which, while retaining its exact output stage switch clock, is simply constructed and has a relatively small overall size. The power amplifier includes at least one switch output stage. A power bridge circuit includes a predefined number of switch elements. The power bridge circuit is connected to a floating intermediate circuit voltage and at least one pulse width modulator, which generates pulse-width-modulated control signals for all switch elements of the power bridge circuit from input signals in order to generate at least one output stage voltage according to an output stage switch clock. The pulse width modulator is embodied as a digital pulse width modulator to which digital input signals can be supplied. The pulse-width-modulated control signals simulate the control signals of an analog pulse width modulator. The generated output stage voltages have an at least nearly analog curve. A premodulator connects upstream of the digital pulse width modulator. A predefinable number of input signals for the digital pulse width modulator can first of all be supplied to the premodulator. It being possible to then supply the output signals of the premodulator to the digital pulse width modulator as input signals.

DE 19857525 A1 also discloses a premodulator. The premodulator includes a power amplifier which, while retaining its exact output stage switch clock, is simply constructed and has a relatively small overall size. The power amplifier includes at least one switch output stage. A power bridge circuit includes a predefinable number of switch elements. The power amplifier is connected to a floating intermediate circuit voltage and at least one pulse width modulator that generates pulse-width-modulated control signals for all switch elements of the power bridge circuit from input signals in order to generate at least one output stage voltage according to an output stage switch clock. The pulse width modulator is embodied as a digital pulse width modulator to which digital input signals can be supplied and the pulse-width-modulated control signals of which simulate the control signals of an analog pulse width modulator, with the result that the generated output stage voltages have an at least nearly analog curve.

DE 103 53 965 A1 discloses amplifiers.

The known premodulators provide improved modulator input signals for controlling a modulator, in particular for an increase in the resolution of the modulator. However, there is a fundamental need for a further increase in the resolution, in particular for imaging equipment in medical engineering.

SUMMARY

The present embodiments may obviate one or more of the limitations or drawbacks inherent in the related art. For example, in one embodiment, modulator input signals are provided that allow operation of a modulator with increased resolution.

In one embodiment, a method includes generation of at least one modulator input signal from at least one regulator signal and at least one dither signal added to the regulator signal. The regulator signal is in digital form with a length of m bits. The modulator input signal is digitally output with a length of n bits, where m>n. The dither signal is generated on the basis of the periodic output of elements of a discrete dither sequence (DF). The dither sequence (DF) may take the basic form of DF=0, 1, 2, ... $2^{(m-n)}-1$. "According to the basic form" means that elements of this form or elements derived therefrom are used. An exact time response for optimal effect of the dither signal can be specified by the discrete dither sequence. The modulator input signals can be adjusted in order to provide an optimal resolution of a modulator.

In one embodiment, two synchronous modulator input signals are output to avoid output voltages at a modulator due to the dither signals.

In one embodiment, the dither signal is added to a first regulator signal that generates a first modulator input signal and to a second regulator signal inverted thereto that generates a second modulator input signal.

An integer may be added to the dither sequence (DF) according to the basic form.

In one embodiment, the dither sequence according to the basic form may be multiplied by an integer other than $2^{(m-n)}/(m-n)$ or the like.

The dither sequence (DF) according to the basic form can also be combined with other dither sequences according to the basic form.

In one embodiment, the sequence of elements of the dither sequence is changed so that the output signal of the output stage or of the modulator caused by dithering is of optimally high frequency.

In the case of a plurality of channels, the same dither signal can be used for each one of the plurality of channels.

In one embodiment, the elements of the dither sequence may be read from a lookup table or recoding table. The elements of the dither sequence may be read as a function of a gradually changing count. A change in the count (for example, a cyclical increment) may be triggered by an external trigger signal, by a compare signal of a modulator connected downstream that detects a peak of a triangle signal used in the case of a pulse width modulation, or by the modulator input signals being input into this modulator.

The count may be changed following arrival of each external trigger signal. The count may be changed with a connection in series of modulators/output stages. The elements of the dither sequence may be output with a phase offset.

Alternatively, the count may be changed following arrival of a predefined number of external trigger signals. For example, the count may be changed following arrival of a predefined number of external trigger signals which correspond to a number of the output stages/modulators of a channel that are connected in series.

BRIEF DESCRIPTION OF THE DRAWINGS

FIG. 4 shows a schematic diagram of a generation of modulator input signals by means of regulator signals.

FIG. 5 shows a schematic diagram of a generation of modulator input signals by means of regulator signals and offset signals.

FIG. 6 shows a plotting of characteristics of a modulator.

FIG. 8 shows a plotting of a characteristic of a modulator with a dither signal according to the invention and a corresponding deviation of the linearity of the plotting from an ideal curve.

FIG. 10*b* shows a continuation of FIG. 10*a*.

DETAILED DESCRIPTION

Figure 1:
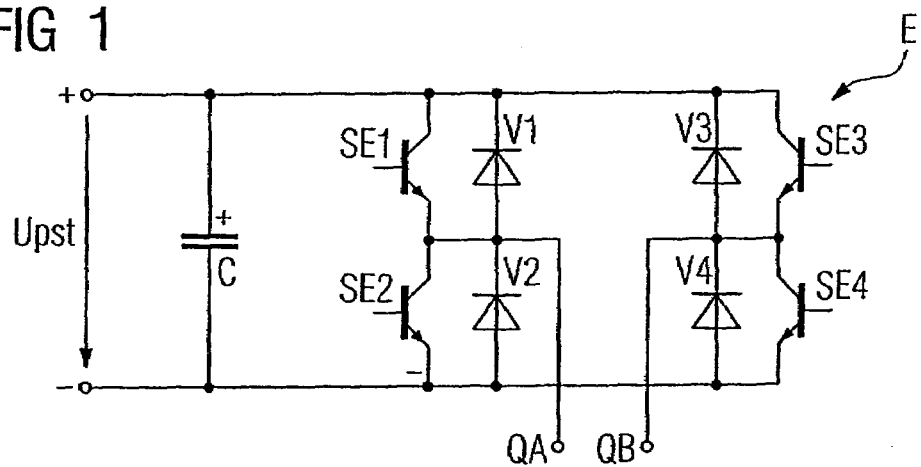
FIG. 1 shows a circuit diagram of a known switch amplifier output stage.

As shown in FIG. 1, DE 19857525 A1 discloses a switch amplifier output stage E. DE 19857525 A1 describes how a signal is converted in the modulator into a pulse width modulation for activating one or more switch amplifier output stages E. The source of the signal may be, for example, the output of a controller, which according to DE 103 53 965 A1 can potentially be evaluated using a measured value of the output stage voltage. The switch amplifier output stage E includes four switch elements SE1 . . . SE4, shown in FIG. 1 as NPN transistors, four freewheeling diodes V1 . . . V4, an energy storage, shown as capacitor C, and a floating voltage supply Upst. The switch amplifier output stage supplies a positive voltage if its output QA is positive compared with QB.

In one embodiment, when conducting-state voltages at the switch elements and diodes are ignored, the output stage may supply a positive voltage if SE1 and SE4 are switched on at the same time and SE2 and SE3 are switched off. The output stage may be a negative voltage if SE2 and SE3 are switched on at the same time and SE1 and SE4 are switched off. The output stage does not supply any voltage if it is in a freewheeling mode, for example, when SE1, SE3 are "on" and SE2, SE4 are "off" or SE2, SE4 are "on" and SE1, SE3 are "off."

In one embodiment, when a current flows through a connected inductive load, the current direction may be used to determine the polarity of the voltage supplied by the output stage. For example, when all switch elements are switched off, the output stage can provide a positive voltage when a current flows from the connected (inductive) load into QA and from QB back into the load. The current in the output stage of QA may flow over V1 into the positive side of the energy storage C. The current may charge the energy storage C with energy from the load in the process. The current may flow from the negative side of C via V4 to QB.

Figure 2:
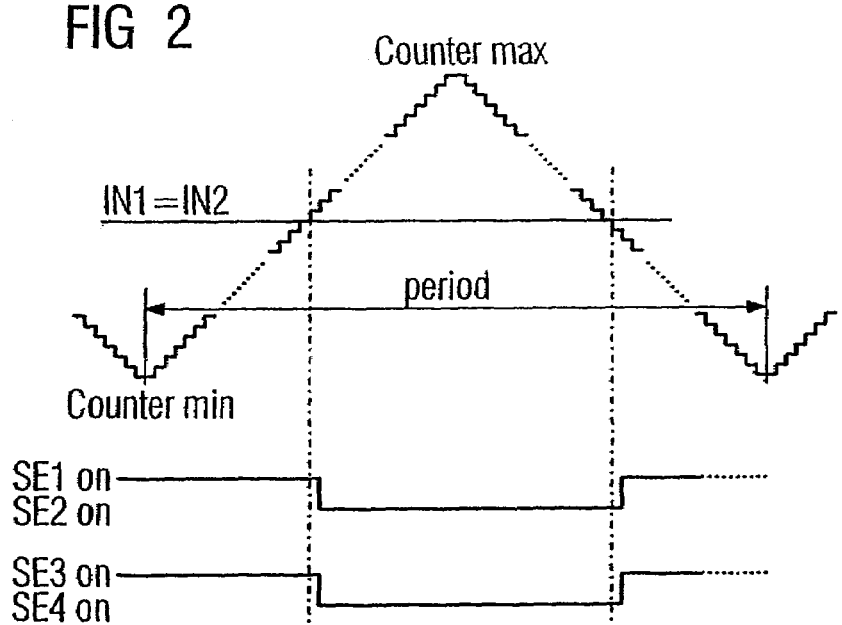
FIG. 2 shows a plotting of a triangle signal in a modulator and the switching state of associated switch elements as a function of modulator input signals in a first relation.
Figure 3:
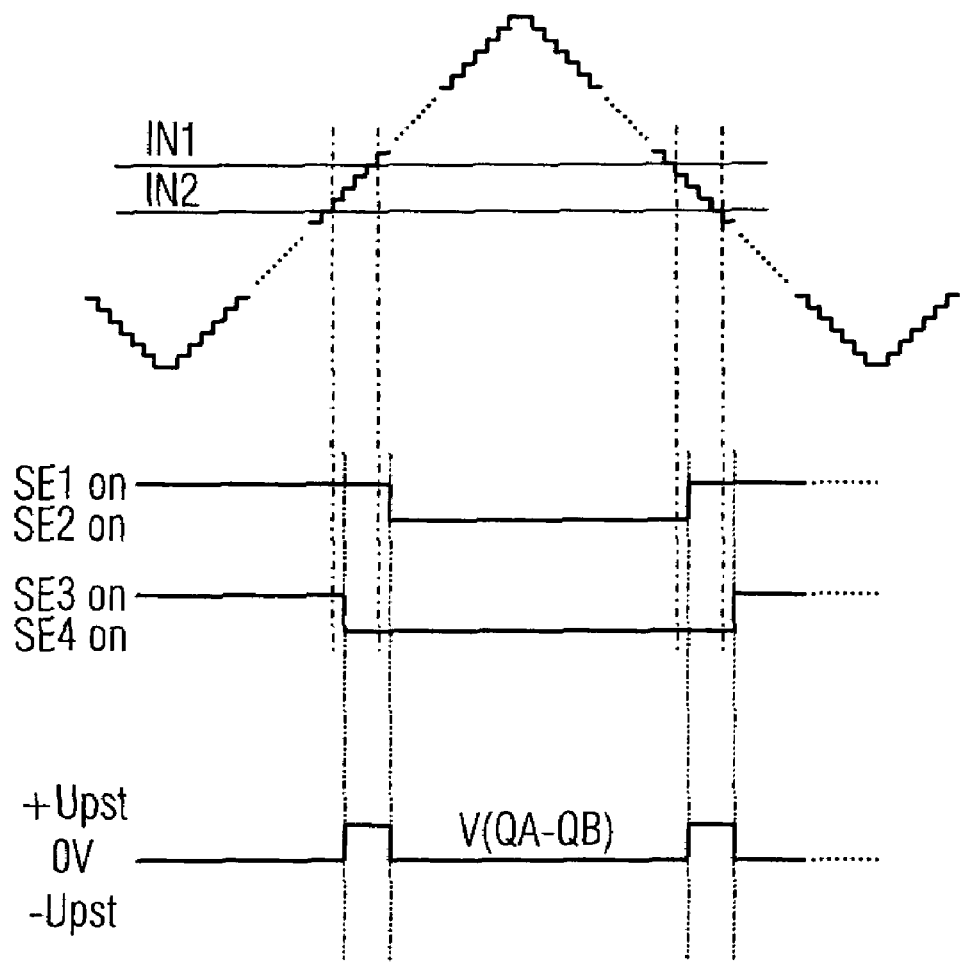
FIG. 3 shows a plotting of a triangle signal in a modulator and the switching state of associated switch elements as a function of modulator input signals in a second relation.

FIG. 2 and FIG. 3 show how the modulator generates the pulse width modulation from two modulator input signals IN1 and IN2. In one embodiment, a triangle signal is generated, for example, by counters in the modulator and ascends and descends between a minimum and a maximum value. A comparator may compare the triangle signal with IN1 and IN2.

In one embodiment, when the input (IN1 or IN2) is greater than the triangle signal, the output of a memory module (for example a JK flip-flop) is set to "high" with the next clock. When the input is smaller than the triangle signal, the output of the memory module is set to "low" with the next clock. IN1 acts on a first memory module. The output of the memory module may be used to determine whether SE1 (in this example when "high") or SE2 (when "low") is switched on. IN2 acts in the same way on a second memory module. The output of the second memory module may be used to determine whether SE3 (when high) or SE4 (when low) is switched on.

The modulator may include additional functions. For example, the modulator may be used for basic blocking of the output stage and generation of safety times in the activation of the switch elements.

When the two modulator inputs are equal in size, as shown in FIG. 2, the states of the memory modules are the same. Because the states of the memory modules are the same, SE1 and SE3 or SE2 and SE4 are always switched on at the same time. The output stage may always be in freewheeling mode and may not supply any voltage.

In one embodiment, as shown in FIG. 3, IN1 is greater than in FIG. 2. IN2 is smaller than in FIG. 2. Because IN1 is larger, SE1 is proportionally switched on for longer than SE2. Because IN2 is smaller, SE4 is proportionally switched on for longer than SE3. As may be seen from FIG. 3, SE1 and SE4 are switched on at the same time at an area at both edges of the triangle signal. The output stage provides a positive voltage because SE1 and SE4 are switched on at the same time at the area at both edges of the triangle signal. Two positive voltage pulses of the output stage voltage (V(QA-QB)) are generated per triangle period. The switching period of a switch element is equal to the period of the triangle signal. The time integral over the voltage pulse divided by half the triangle period is often designated the effective output voltage.

Resolution of the Modulator

The resolution of the modulator may be determined by the number of counts from which the triangle signal is formed.

In one embodiment, when the modulator counter has $n=12$ bits and reciprocates between zero and the maximum value $2^{12}-1$, the $2^n=2^{12}=4096$ counts (for example 0 to 4095 or $-2048$ to $+2047$) result therefrom. The two inputs of the modulator IN1 and IN2 are derived from one signal. The one signal may include, for example, the (evaluated) regulator signal. IN1 and IN2 are not independent, for example, initially $IN1=-IN2$ or $IN1+2^n/2=-IN2+2^n/2$. Because IN1 and IN2 are not independent, $2^n=4096$ possible pulse durations of the output stage result and the resolution is therefore $(+Upst-(-Upst))/2^n=2Upst/2^n$.

The pulse duration at which the output stage generates an output voltage is determined from the difference in inputs IN1−IN2.

| IN1 | IN2 (=−IN1) | IN1 − IN2(--> pulse duration) |
|---|---|---|
| ... | ... | ... |
| −3 | 3 | −6 |
| −2 | 2 | −4 |
| −1 | 1 | −2 |
| 0 | 0 | 0 |
| 1 | −1 | 2 |
| 2 | −2 | 4 |
| 3 | −3 | 6 |
| ... | ... | ... |

As an example, the input signal is IN1=1. The length of the output stage control is equal to the length of two count steps of the triangle signal. The two triangle sides of the triangle signal each include $2^n$ steps. For example, when the switching frequency of a switch element is 25 kHz, the clock frequency of the counter for generating the triangle signal at n=12 bit resolution is: $2*2^{12}*25$ kHz=204.8 Mhz. A period of the clock is about 4.88 ns and the time resolution of the output stage controller is 9.76 ns.

Generation of a Modulator Input from a High-Resolution Signal

In one embodiment, the modulator inputs IN1 and IN2 are derived from a signal HIRES. The signal HIRES, for example, may be a regulator output with high resolution. The signal HIRES has a sign and is in the form of a two's complement. In the two's complement the highest bit (MSB=most significant bit) is the sign bit. For example, when the MSB=1, the signal HIRES is a negative number. In the two's complement the numerical range >0 (positive range) and <0 (negative range) is moreover not identical. The negative range is greater by one number. Example: number in two's complement with 3 bits:

| Two's complement | Decimal | Numerical range |
| --- | --- | --- |
| 011 | 3 | >0 |
| 010 | 2 | >0 |
| 001 | 1 | >0 |
| 000 | 0 | |
| 111 | −1 | <0 |
| 110 | −2 | <0 |
| 101 | −3 | <0 |
| 100 | −4 | <0 |

In one embodiment, mapping of number_1=−number_2 may only be carried out if the most negative number (e.g., "−4") is excluded since there is no corresponding positive number with this bit resolution (+4 would correspond to 0010, i.e. have 4 bits). Mapping such as number_1=−number_2 can be achieved by each bit of IN1 being inverted and "+1" being added to the result. The following example illustrates this: 2 (decimal) corresponds to 010 (two's complement), then each bit is inverted to give 101 (two's complement) corresponding to −3 (decimal). Addition of +1 (001) produces 101+001=110, for example, −2 (decimal).

The signal with high resolution, HIRES, may be limited to m bits, for example, HIRES(m) or HIRES[(m−1) . . . 0]. The input signal IN(n) may be obtained from the signal HIRES (m), where n<m. This corresponds to a division of HIRES by $2^{(m-n)}$.

In one exemplary embodiment, m=16, n=12. $2^{(m-n)}=2^{(16-12)}=2^4=16$. HIRES(m) is divided by 16. Division by powers of 2 may be carried out by bit displacement, for example, the bits HIRES[(m−1) . . . (m−n)] are mapped to IN[(n−1) . . . 0].

In one exemplary embodiment, HIRES[15 . . . 4] is mapped to IN[11 . . . 0]. This is synonymous with discarding of the lower (m−n) bits of HIRES, for example for m=16 HIRES[15 . . . 0]=0 010 011 101 000 111.

In one embodiment, discarding the lower bits may correspond to a division of $2^{(m-n)}$ and rounding to the next whole number, which is less than or equal to the original number (integer function). As an example where (m−n)=4, for example, divided by 16 it follows that:

| HIRES | HIRES/16 | IN = INT(HIRES/16) |
| --- | --- | --- |
| 32 | 2 | 2; |
| 20 | 1.25 | 1; |
| −8 | −0.5 | −1 |
| −40 | −2.5 | −3 |

FIG. 4 shows that from the high resolution signal HIRES the signal N_HIRES is obtained by inverting the individual bits and from this −HIRES is obtained by adding "+1". Alternatively, an arithmetic logic unit "subtraction" with "0"−"HIRES" could also be used. Only now are HIRES and −HIRES limited to m bits (LIMIT m bit), for example, to a numerical range of $-(2^{m-1})$ to $+2^{m-1}-1$ (A bit overflow could otherwise occur in the case of an addition following the limit). The function of "Limit" is that each value of HIRES, which is greater than $+2^{m-1}-1$, brings about the maximum value of $+2^{m-1}-1$ and each value of HIRES less than $-2^{m-1}$ is limited to the minimum value of $-2^{m-1}$.

For example, when m=16 "limit" is limited from $-2^{15}$ to $+2^{15}-1$, for example, from −32768 to +32767. This is the numerical range that can be represented by 16 bits.

The values of HIRES(m) and −HIRES(m) limited to m bits may be divided by bit displacement among the values IN1s(n) and IN2s(n).

In one embodiment, IN1s(n) and IN2s(n) are input signals for a modulator of the triangle signal of which lies between a negative and a positive value (s designates sign-sensitive or "signed"). When a counter circuit which ascends and descends between zero and a maximum value $2^{n-1}$ is used in the modulator, the value $2^{n-1}$ must also be added to IN1s(n) and IN2s(n), respectively. Although no complex logic is required, only the MSB of INs(n) and −INs(n) has to be inverted in each case.

The following serve as examples:
IN1[n−1]=N_IN1s[n−1]; IN1[(n−2) . . . 0]=IN1s[(n−2) . . . 0]
IN2[n−1]=N_IN2s[n−1]; IN2[(n−2) . . . 0]=IN2s[(n−2) . . . 0]

The MSB is no longer a sign bit.
Example: n=3, 2^(n−1)=4

| INs(3) | INs(3) decimal | IN(3) | IN(3) decimal |
| --- | --- | --- | --- |
| 011 | 3 | 111 | 7 = 3 + 4 |
| 010 | 2 | 110 | 6 = 2 + 4 |
| 001 | 1 | 101 | 5 = 1 + 4 |

| | HIRES(m) bit no. | | | | | | | | | | | | | | | |
| --- | --- | --- | --- | --- | --- | --- | --- | --- | --- | --- | --- | --- | --- | --- | --- | --- |
| | 15 | 14 | 13 | 12 | 11 | 10 | 9 | 8 | 7 | 6 | 5 | 4 | 3 | 2 | 1 | 0 |
| HIRES(m) = 16 | 0 | 0 | 1 | 0 | 0 | 1 | 1 | 1 | 0 | 1 | 0 | 0 | 0 | 1 | 1 | 1 |
| IN(n) bit no. | 11 | 10 | 9 | 8 | 7 | 6 | 5 | 4 | 3 | 2 | 1 | 0 | | | | |
| IN(n) = | 0 | 0 | 1 | 0 | 0 | 1 | 1 | 1 | 0 | 1 | 0 | 0 | | | | |

-continued

| INs(3) | INs(3) decimal | IN(3) | IN(3) decimal |
|--------|----------------|-------|---------------|
| 000    | 0              | 100   | 4             |
| 111    | −1             | 011   | 3             |
| 110    | −2             | 010   | 2             |
| 101    | −3             | 001   | 1 = −3 + 4    |
| 100    | −4             | 000   | 0 = −4 + 4    |

A triangle signal with a sign could also be obtained from a purely positive counter triangle by inverting the counter MSB.

Increasing the Resolution of the Modulator

Offset Shift

DE19857524A1 describes how the resolution of the modulator can be increased by a (total) offset of preferably 0.5LSB (least significant bit). These 0.5 LSBs refer to the resolution of n bits. For HIRES this may mean that: $0.5@n=0.5*2^{m-n}@m$ (where @n and @m indicate to which numerical data (IN or HIRES) the value refers).

For example: m=16, n=12; $0.5LSB@n=0.5*2^4@m=8@m$

In one embodiment, a common mode offset with 0.25LSB@n (more precisely k*=/−0.25LSB@n, where k=1, 3, 5, 7 . . . ) may be added to HIRES and −HIRES.

In one embodiment, as shown in FIG. 5, the signals HIRES and −HIRES may be formed but, before the limit to m bits, an offset is added. IN1 and IN2 are obtained as in FIG. 4 from the signals HIRES1 and HIRES2 by bit displacement.

The top part of FIG. 6 shows the characteristic of the modulator without offset (i.e. according to FIG. 4). The bottom part of FIG. 6 shows the characteristic with common mode offset −0.25LSB@n (OFFSET1=OFFSET2=00.25LSB@n). As can be seen, the resolution is practically doubled.

Dithering

Figure 7:
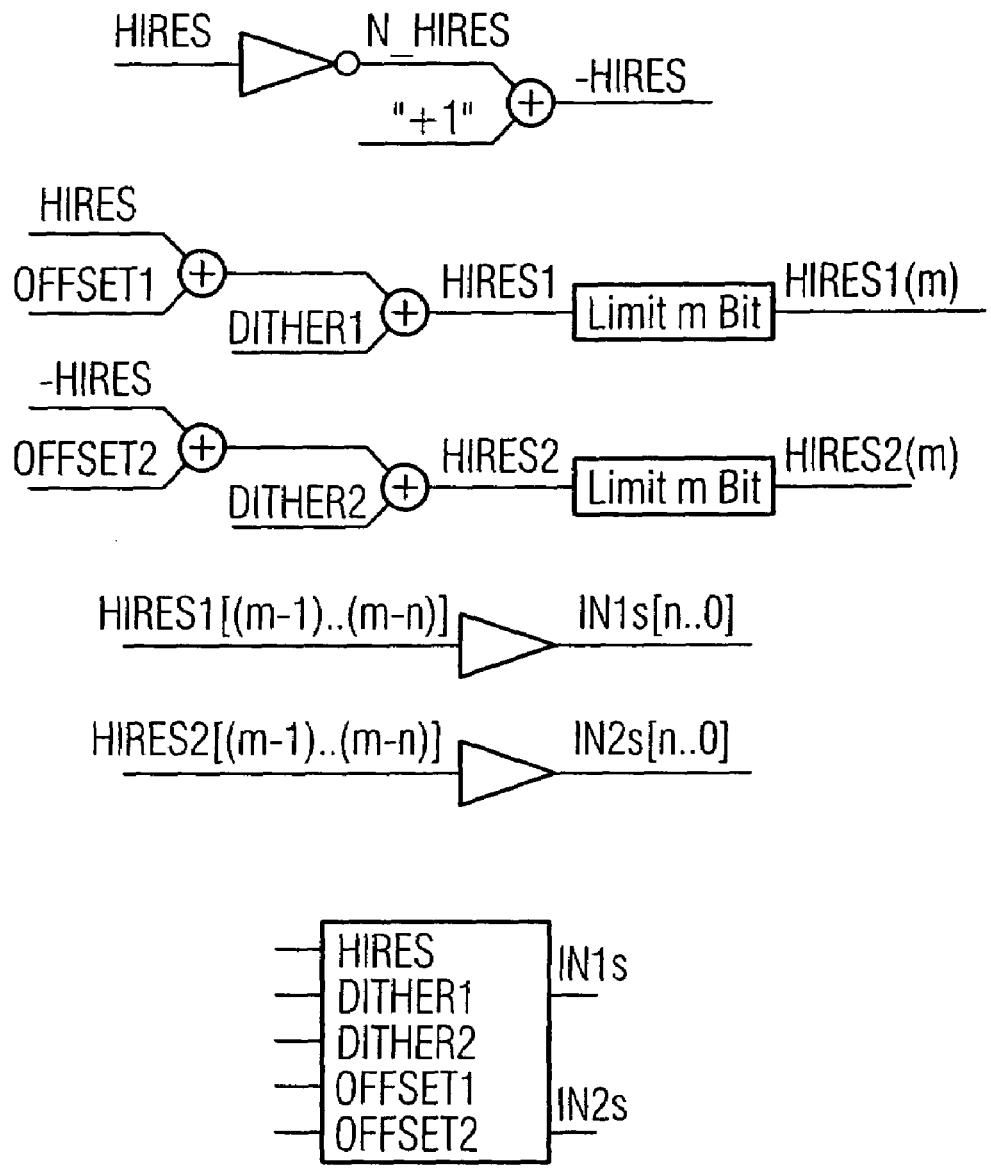
FIG. 7 shows a schematic diagram of a generation of modulator input signals by means of regulator signals, offset signals and dither signals.

FIG. 7 is different than FIG. 5 because, in addition to the offset, a dither signal is also added to HIRES and −HIRES. The illustrated basic circuit schematic constitutes the contents of the symbol shown at the bottom of FIG. 7.

DE19857524A1 describes a general use of a dither signal. DITHER1=DITHER2 should be the case, for example, the dither signal is supplied as a common-mode signal. If the dither signal were to be supplied as a push-pull signal, the dithering itself would lead to an output voltage of the output stage. A dither signal may only have an effect if it is applied at an instant at which activation for the output stage is generated. In the diagram according to FIG. 3, the (small) dither signal would be ineffective if, for example, it only existed during the triangle peaks.

In one embodiment, the dither signal is a sequence of numbers. The prior art describes uses of an analog dither signal, with a digital premodulator. Each number from the (discrete) numerical sequence of the dither signal should be associated with at least one possible change in the activation of the output stage. DE19857525A1 describes an arrangement where the output stage is activated in the case of the modulator during an edge of the triangle signal (see FIG. 3). The dither signal may be incremented in the triangle peak. Since the modulator described uses an activation that takes place at the two triangle edges, the dither signal may be incremented most quickly and effectively when the upper and the lower triangle peaks trigger incrementing. In contrast to DE 19857524A1, which uses an digital premodulator, an exact time response may be indicated for the optimum effect of the dither signal.

By way of example a signal HIRES is limited to m=16 bits. IN1, IN2 exist in the resolution n=12 bits. The dither signal is a triangle that changes around zero with values from −11 to +10 to −11. The values −11 and +10 occur only once per period, all values in between occur twice (once each during the increase and once during the decrease). The period of this signal is 42.

| HIRES | −   | ΣINs1/Period  | ΣINs2/Period  | ΣINs1/P−      | Ideal  | Difference   |
|-------|-----|---------------|---------------|---------------|--------|--------------|
| −11   | 11  | −1.261904762  | 0.261904762   | —             | −1.375 | 0.148809524  |
| −10   | 10  | −1.19047619   | 0.19047619    | —             | −1.25  | 0.130952381  |
| −9    | 9   | −1.095238095  | 0.095238095   | −1.19047619   | —      | 0.06547619   |
| −8    | 8   | −1            | 0             | −1            | −1     | 0            |
| −7    | 7   | −0.904761905  | −0.095238095  | −0.80952381   | —      | −0.06547619  |
| −6    | 6   | −0.80952381   | −0.19047619   | —             | −0.75  | —            |
| −5    | 5   | −0.738095238  | −0.261904762  | —             | —      | —            |
| −4    | 4   | −0.69047619   | −0.30952381   | −0.380952381  | −0.5   | —            |
| −3    | 3   | −0.642957143  | −0.357142857  | −0.285714286  | —      | −0.089285714 |
| −2    | 2   | −0.595238095  | −0.404761905  | −0.19047619   | −0.25  | −0.05952381  |
| −1    | 1   | −0.547619048  | −0.452380952  | —             | —      | −0.029761905 |
| 0     | 0   | −0.5          | −0.5          | 0             | 0      | 0            |
| 1     | −1  | −0.452380952  | −0.547619048  | 0.095238095   | 0.125  | 0.029761905  |
| 2     | −2  | −0.404761905  | −0.595238095  | 0.19047619    | 0.25   | 0.05952381   |
| 3     | −3  | −0.357142857  | −0.642857143  | 0.285714286   | 0.375  | 0.089285714  |
| 4     | −4  | −0.30952381   | −0.69047619   | 0.380952381   | —      | 0.119047619  |
| 5     | −5  | −0.261904762  | −0.738095238  | 0.476190476   | 0.625  | 0.148809524  |
| 6     | −6  | −0.19047619   | −0.80952381   | 0.619047619   | 0.75   | 0.130952381  |
| 7     | −7  | −0.095238095  | −0.904761905  | 0.80952381    | 0.875  | 0.06547619   |
| 8     | −8  | 0             | −1            | 1             | 1      | 0            |
| 9     | −9  | 0.095238095   | −1.095238095  | 1.19047619    | 1.125  | −0.06547619  |
| 10    | −10 | 0.19047619    | −1.19047619   | 1.380952381   | 1.25   | −0.130952381 |
| 11    | −11 | 0.261904762   | −1.261904762  | 1.523909524   | 1.375  | −0.148809524 |

The values of the column HIRES are predefined. The values of −HIRES correspond to −1*HIRES. For each row, ΣIN1s is the total of IN1s over one period of the dither signal.

For example, ΣNs1=(1*(INTEGER ((HIRES+(−11))/16)))+2*(INTEGER((HIRES+(−10))/16)))+2*(INTEGER ((HIRES+(−9))/116)))+2*(INTEGER((HIRES+(−8))/16)))+ . . . +2*(INTEGER((HIRES+(7))/16)))+2*(INTEGER((HIRES+(8))/16)))+2*(INTEGER((HIRES+(9))/16)))+2*(INTEGER((HIRES+(10))/16))).

Dividing by the period P gives the mean of IN1s. Dividing by the period P may be applied to ΣIN2s and the mean of IN2s. ΣIN1s/P-ΣIN2s/P is the difference in these mean values, corresponding to a mean activation to the output stage (V(QA-QB) averaged over one period of the dither signal. The values of the column "Ideal" are calculated from the value of HIRES and the ideal rise. Assuming HIRES changes by the value 16@m, a value IN would ideally change by 16/16@n=1@n. Since both IN1 and IN2 change and the changes are in opposite directions, the difference IN1-IN2 changes by the value 2@n. The ideal rise is therefore $2/2^{m-n}$·Ideal=HIRES*$2/2^{m-n}$. The column Difference shows the difference from the Ideal and ΣIN2s/P-ΣIN2s/P.

The top part of FIG. 8 shows the linearity of the modulator with the dither signal. Compared with the graphs in FIG. 6 of the known dither signals the linearity is significantly better. The Ideal curve is also plotted.

The linearity of the modulator is close to the Ideal curve. The difference in the linearity from the Ideal curve is shown in the bottom part of FIG. 8. A difference is also indicated if, in addition to the dither signal, a common mode offset of 0.25LSB were also to act.

The Ideal Dither Signal

By way of example it is accordingly again assumed that m=16, n=12 and $2^{m-n}=2^4=16$.

HIRES can be converted into IN without a division remainder every 16 steps @m. Between these values there are 15 values which cannot be converted into IN without a remainder. This allows the conclusion that the ideal dither signal will be a sequence of $2^{m-n}=16$ numbers, for example, DF=0, 1, 2, 3, 4, 5, 6 . . . 15 (DF=dither sequence).

For example, it is assumed that HIRES is zero. Each value of the DF is added to HIRES respectively, for example, resulting in 0, 1, 2, . . . 15. If each value is divided by $2^{m-n}=16$ and the integer is formed therefrom, the result is zero each time. The total of all values equals zero. Zero divided by the period (the number of elements of DF=16), for example, 0/16, also equals zero as a mean over one period.

For example, it is assumed that HIRES is 1. Each value of the DF is added to HIRES respectively, for example, resulting in 1, 2, 3, . . . 16. If each value is divided by $2^{(m-n)}=16$ and the integer is formed therefrom, the result is 15 times zero, but INT(16/16) equals 1. The total of all values 0+0+0 . . . 0+1=1. The total of all values divided by the period equals 1/16 as the mean.

For example, it is assumed that HIRES is 2. Each value of the DF is added to HIRES respectively, for example, resulting in 2, 3, . . . 15, 16, 17. If each value is divided by $2^{m-n}=16$ and the integer is formed therefrom, the result is 14 times zero, but INT(16/16)=1 and INT(17/16)=1. The total of all values=0+0+0 . . . 0+1+1 equals 2. The total of all values divided by the period equals 2/16 as the mean.

In one embodiment, the resolution of IN(n) is to be increased to the resolution m by dithering with the numerical sequence DF=0, 1, 2, . . . , $(2^{m-n}-1)$. Since the modulation principle according to FIG. 2 and FIG. 3 brings about a difference in the inputs IN1 and IN1 and the dither signal is fed in as a common-mode signal, an offset of the dither sequence may be omitted. For example, if each element of the dither sequence is shifted by an integer, a dither sequence is obtained which is ideal. By way of example, −8, −7, −6, . . . , 0, . . . , 6, 7 or 3, 4, 5, . . . , 18 are ideal dither sequences for m−n=4.

Figure 10A:
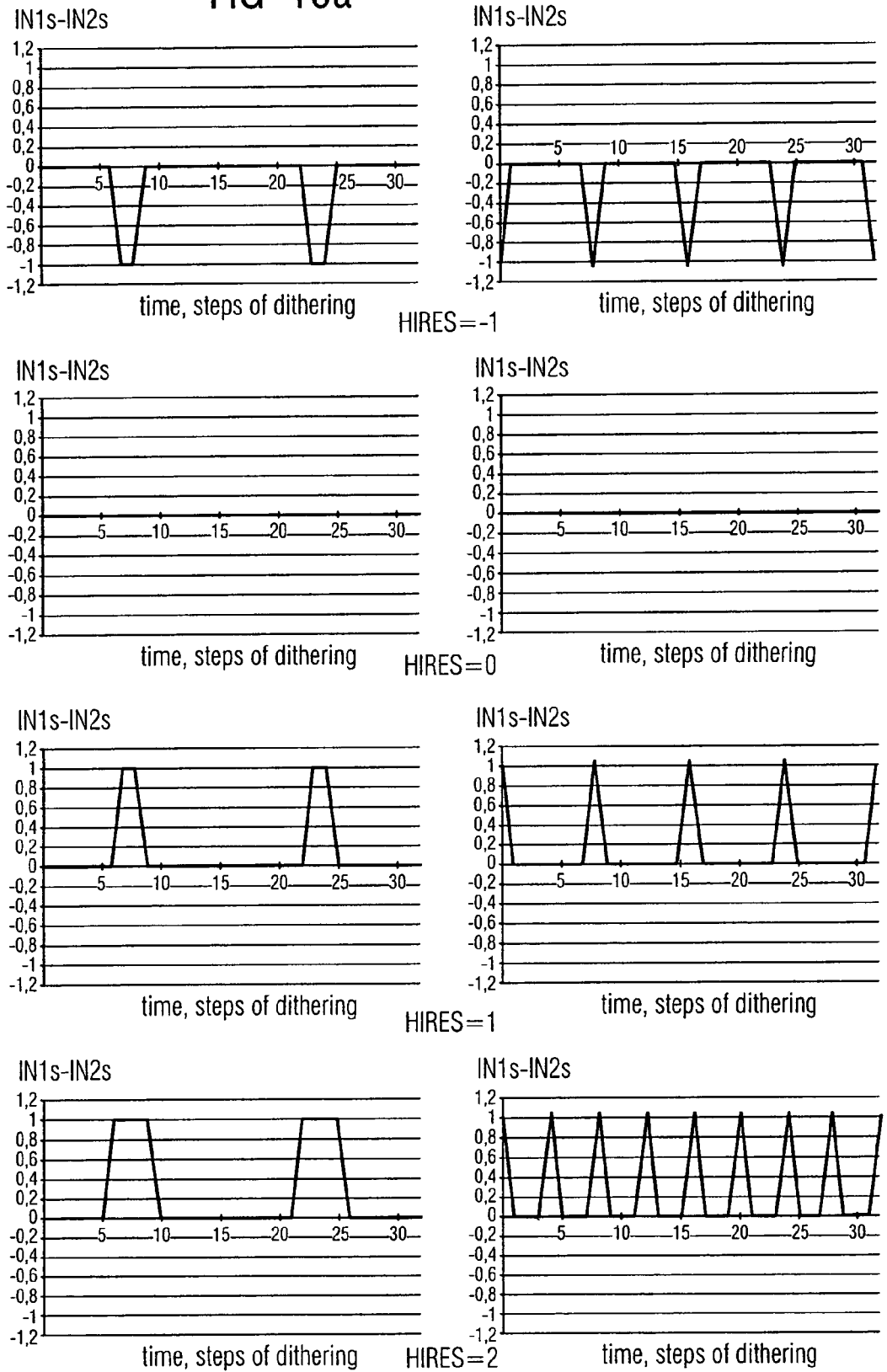
FIG. 10*a* shows the variation over time of the modulator input signals as a function of the value of the regulator signal for a dither sequence according to the invention.

If ideal dither sequences are combined, the result is again ideal with respect to linearity. Example: m−n=4, the sequence −8, −7, −6 . . . +6, +7 is combined with the sequence +8, +7, +6 . . . −6, −7. The result would be a triangle. The peaks (+8 and −8) of the triangle emerging once per period. It would be possible to use such a signal in the analog technique. FIG. 10*a* shows a corresponding graph for selected values of HIRES.

An ideal dither sequence can in each case also be multiplied by an integer if this integer is not a multiple by $2^{m-n}/(m-n)$, for example, by +/−1, +/−2, +/−3, not +/−4, +/−5 . . . not +/−8, . . . .

Variation Over Time of the Ideal Dither Signal

It follows from m=16, n=12 that the dither sequence is 0, 1, 2, 3, . . . , 14, 15. With the value HIRES=8, the result of the integer formation would be (method see above): 0, 0, 0, 0, 0, 0, 0, 0, 1, 1, 1, 1, 1, 1, 1, 1. The mean would thus correspond to 8/16. Whenever a 1 appears, current is generated in the gradient coil. Whenever a zero appears, current is reduced in the gradient coil. Since 8*1 and 8*0 always follow one another, a low-frequency oscillation (period=16*2*(triangular period of the modulator)) with disruptive amplitude would occur. During MR imaging, it is desirable for the frequency of the oscillation to be as high as possible and/or for the time integral over the amplitude of the oscillation to be as small as possible for any desired time segment.

Frequency of the oscillation that is as high as possible and/or the time integral over the amplitude of the oscillation that is as small as possible for any desired time segment may be achieved as a result of the integer formation: 0, 1, 0, 1, 0, 1, 0, 1, 0, 1, 0, 1, 0, 1, 0, 1.

The number of "0" and "1" has remained the same but the frequency is optimally high (period=2*2*(triangular period of the modulator)). The resulting current amplitude would be very low since current is only ever briefly generated and then reduced again. This is achieved by recoding, for example, changing the sequence of elements of the ideal dither sequence.

Figure 9:
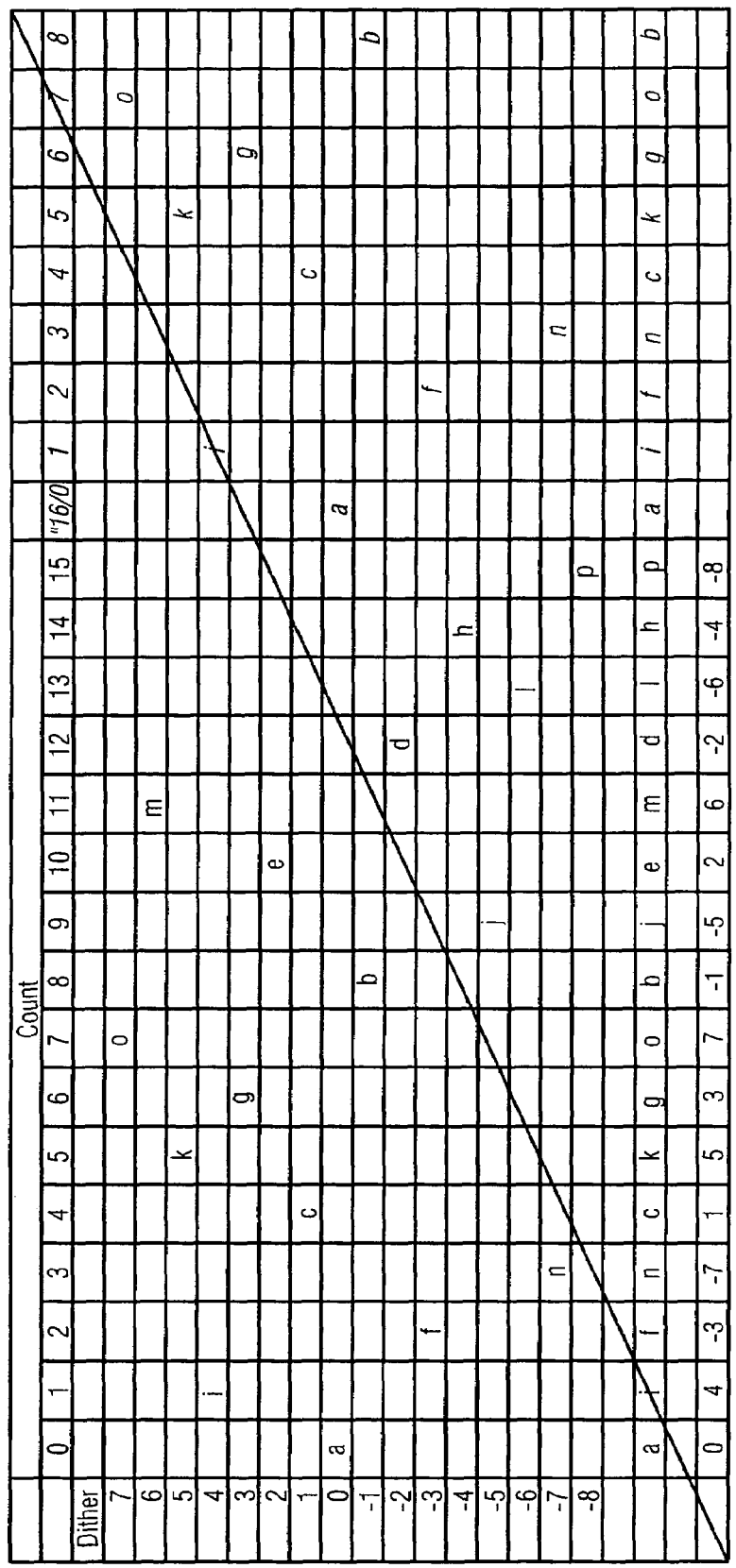
FIG. 9 shows a recoding table.

FIG. 9 shows a recoding table. The table extends over 1.5 periods, so it may be seen how the table continues when viewed "periodically".

Using the example m=16, n=12, m−n=4, $2^{m-n}=16$, a sequence that is symmetrical to zero is chosen as an ideal dither sequence, for example, −8, −7, −6, . . . , +6, +7. This dither sequence, as a result of the integer formation, will cause an offset of −0.5LSB in the mean of IN2S and IN2s and therefore symmetrize the numerical range of the modulator (since the negative numerical range is greater by 1 than the positive numerical range). If it is assumed that HIRES is zero, IN1s and IN2s would also be zero (without additional measures). If HIRES is greater, then IN1s will also be greater; IN2s by contrast will be smaller. The table begins with the dither element zero and expands downward and upward. Once a first entry has been made, the second entry follows offset by half a period. Each additional first entry should halve existing gaps. The situation where entries are close together in adjacent rows should be avoided.

Starting in the row dither=0 the first entry (a) is arbitrarily chosen at count=0. The entry for (b) at count=0 is plus half a period, for example, 8 and in row dither=−1. If the entry for (c) is in row dither=+1, the range 0-8 or 8-16 should be halved, for example, entry for (c) is set at count=4. The entry for (d) takes place in row dither=−2 shifted by half a period (c), for example, 4+8=12. There are now four equal gaps a-c, c-b, b-d, d-a (a of the next period). The next first entry should advantageously be in the middle of these gaps.

The sequence of the alphabet (a to p) indicates how this table has been filled in.

If the zero (or a number k*2(m−n)) is not in the middle of the table, the procedure is as described, but if the table is exited, for example, at the bottom, the table is entered again from the top.

If the table is read from left to right a recoded dither sequence is obtained. In this example it is: 0, 4, −3, −7, 1, 5, 3, 7, −1, −5, 2, 6, −2, −6, −4, −8.

FIGS. 10a and 10b show the variation over time of IN2s-IN2s. This variation over time logically corresponds to an effective output voltage of the output stage. The curve for the dither sequence −8, −7, −6, . . . , 5, 6, 7 is shown on the left. The curve for the dither sequence determined by the recoding table is shown on the right. The parameter is HIRES. At the top HIRES=−1 and increases by "1" (incremented) in each case toward the bottom.

As shown in FIGS. 10a and 10b, the period of the signal on the left is 16, and the period of the signal on the right is at most 8. The worst case illustrated is HIRES=4 (not 8, as illustrated at the start, since the interaction of IN1s and IN2s is decisive). When HIRES=4, the period of the signal on the left is 16 but has a maximum integral value, which causes, for example, maximum "harmfulness" to MR imaging. The period of the signal on the right is 2, as desired at the start.

In one embodiment, an additional common mode offset should no longer be added to a dither sequence found by recoding since this changes the signal curve over time. An offset can be taken into account when the table is created. However, with the ideal dither sequence a common mode offset no longer has an effect on the linearity.

The Ideal Premodulator

In one embodiment, the ideal premodulator generates an ideal sequence of elements of an ideal dither sequence corresponding to a recoding table. Incrementing of the elements of the sequence is triggered by the triangular generator of the modulator. A trigger instant is the instant when the triangle signal of the modulator reaches a peak value of the triangle. Two increments per triangular period may be attained thereby. The dither signal is added to the HIRES signal according to FIG. 7. An additional offset should not be fed in.

Figure 12:
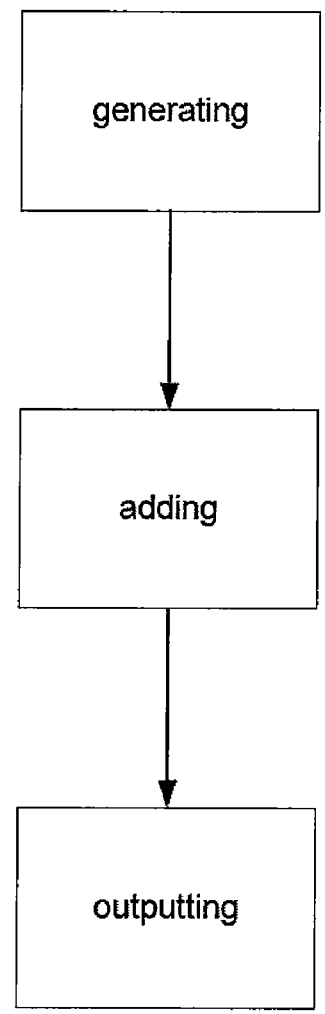
FIG. 12 illustrates a method for generating at least one modulator input signal.

In the case of the gradient amplifier the modulator will only have one triangular generator, which is jointly used for the three channels X, Y, Z. The dither signal is generated jointly for all three channels, as shown in FIG. 12. The dither signal is added to the separate HIRES (X), HIRES (Y), HIRES (Z). IN1(X), IN2(X), IN1(Z), IN2(Y), IN1(Z), IN2(Z) are obtained accordingly, as shown in FIG. 12.

In one embodiment, as shown in FIG. 12, the modulator is configured for a series connection of output stages. The modulator will have a triangular generator for each stage of the series connection. For example, with three output stages connected in series there are three triangular generators that operate in a phase shift of 120 degrees (1/3 period) to each other. Increment signals may be derived from each triangle. Increment signals may be combined. The increment is allowed to proceed at 3 times the speed. The dither signal DF may also change during the triangle edges. Alternatively, one dither generator (for X, Y, Z together in each case, however) may be associated with each stage of the series connection. The dither generators can also run in a phase-shifted manner to achieve a higher overall dither frequency. This modulator would receive an input signal IN1 and IN2 for each stage of the series connection.

For example m=16, n=12, 3 with output stages in series. The dither sequence has 16 elements. 16/3 (output stages)=5 1/3.

In one embodiment, a first output stage has a counter that runs periodically from 0 to 15. When the counter reaches the value 5, it generates an "Enable" signal that resets the second counter. The reset takes place when the increment signal of the second counter arrives. The increment signal arrives with a delay since the second triangle of the modulator is phase-shifted by 120 degrees to the first triangle. When the second counter reaches the value 5, it prepares the resetting of the third counter. The reset takes place when the phase-shifted increment signal arrives. The "5" is therefore achieved by way of the counter and the missing "1/3" by the phase shift that exists in the modulator.

Each counter reads the optimum dither sequence from the recoding table according to its count. According to the example in FIG. 9:

Count=0-->0
Count=1-->4
Count=2-->−3
Count=3-->−7

With an even number k of output stages connected in series a phase shift is produced by $2^{(m-n)}/k$ if no recoding table is used and by $2^{(m-n)}/(2 \cdot k)$ if a recoding table is used. With an uneven number k of output stages connected in series the ideal phase shift is given by $2^{(m-n)}/k$ (with and without recoding table) or else by $2^{(m-n)}/(2 \cdot k)$ if a recoding table is used.

In one embodiment, there are two identically constructed modulator sides. For example, if IN1 is greater, the pulse width for the switch element SE1 is greater. If IN2 is greater, the pulse width for the switch element SE3 is greater. If the modulator halves are constructed differently (that IN2 is greater brings about an increase in the pulse width of switch element SE4) the multiplication of HIRES by "−1" is omitted and instead dither signal and optionally offset must be fed in as a push-pull (multiplied by "−1").

Figure 11:
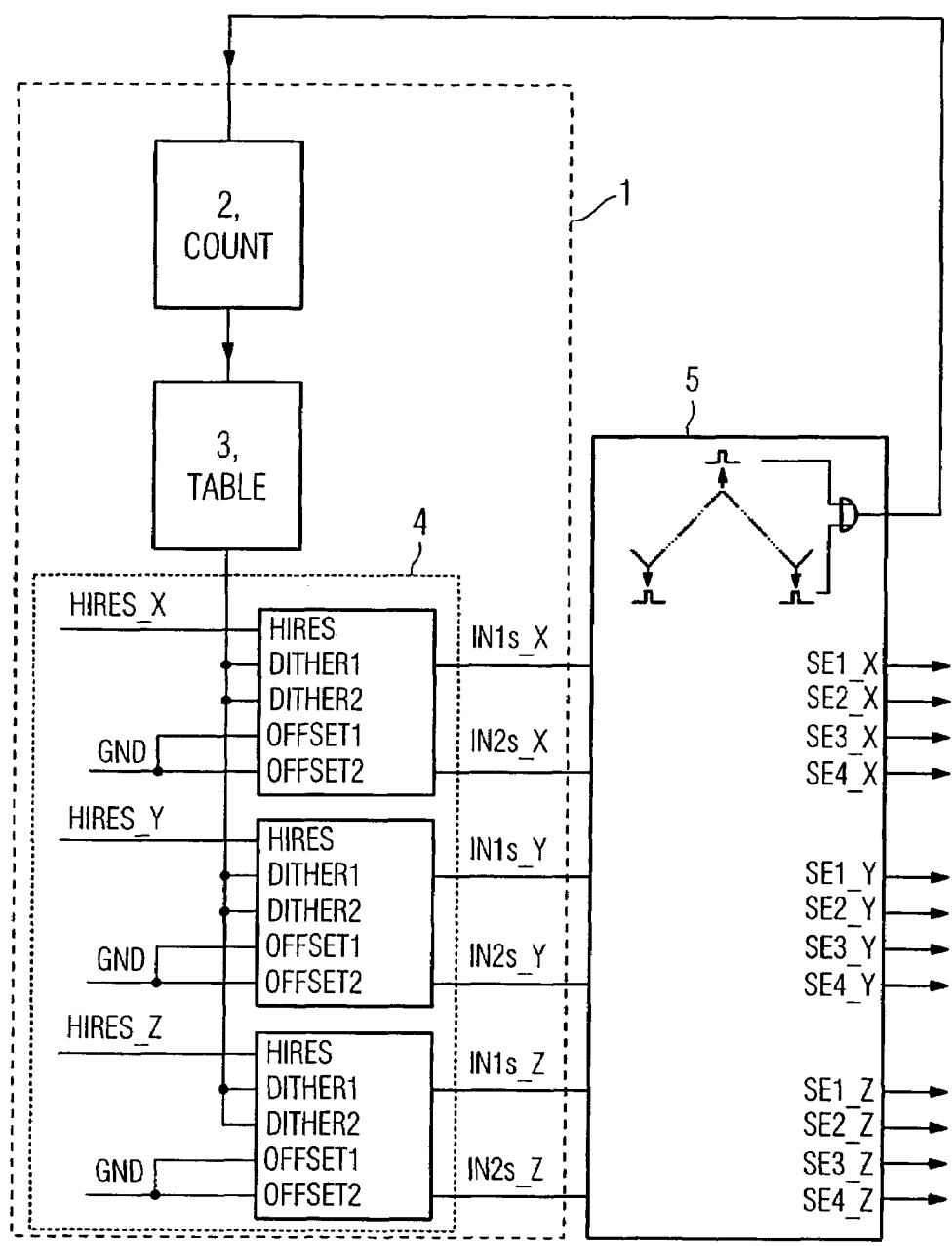
FIG. 11 shows a basic diagram of an interaction of modulator and premodulator.

FIG. 11 shows the interaction of modulator 5 and premodulator 1. Pulses are generated in modulator 5 from the triangle peaks. Pulses of the triangle peaks, when combined (in this case "ORed"), bring about an increment of the counter COUNT in a counter unit 2. Using the COUNT of counter 2, the value of the dither sequence is read from the recoding table TABLE stored in a memory 3 (the combination of counter and table could also be called a "state machine"). The TABLE is passed to the arithmetic logic units or the processing unit 4 of the premodulator. There it is added to HIRES of the respective channel (X, Y, Z) according to FIG. 7. The offset inputs are no longer used. An offset is taken into account in the table.

In one embodiment, the premodulator 1 generates the input signals IN(s)1 and IN(s)2 of the respective channel for the modulator 5. The output signals SE1, . . . , SE4 of the modulator 5 typically control a respective end stage. The output signals of the modulator 5 are produced, for example, by further processing of signals SE1on/SE2on and SE3on/SE4on from FIG. 3 in the modulator.

SUMMARY OF ONE EMBODIMENT

In one embodiment, a digital premodulator 1 is operable to generate a second high-resolution signal −HIRES from a first high-resolution signal HIRES. The second high-resolution signal −HIRES corresponds to −1* the first high-resolution signal HIRES. Numbers of a dither sequence DF and optionally an offset are periodically added to both high-resolution signals HIRES, −HIRES in the digital premodulator 1. Addition of the dither sequence DF occurs such that a common mode is brought about at the output stage output. The incrementing of the numbers of the dither sequence is triggered synchronously with the compare signal (triangle) of the modulator 5. An ideal dither sequence DF is produced. If the resolution of the modulator 5 is to be increased by x (x=m−n), the smallest ideal dither sequence DF consists of $2^x$ elements. An ideal basic sequence can be specified from natural numbers from 0, 1, 2 . . . to $2^x-1$. Further ideal dither sequences may be produced from this basic sequence by adding any desired integer to any element of the sequence. Ideal dither sequences may be combined with further ideal dither sequences to give new sequences which furthermore ensure ideal linearity. Dither sequences can be multiplied by integers to a limited extent provided certain integers are excluded, for example multiples of $2^x/4$.

There are no restrictions in changing the sequence of dither elements in one period. The elements may be arranged such that the output signal of the output stage, caused by dithering, is always of an optimally high frequency.

The dither signals may be generated jointly for channels X, Y, Z.

When output stages are connected in series the increment of the dither generator can be increased according to the number of compare signals (=number of output stages of a channel connected in series). Alternatively, a dither generator may be incremented from the compare signal of each stage of the series connection. The dither generators should be operated in series in a phase shift corresponding to the number k of output stages.

Various embodiments described herein can be used alone or in combination with one another. The forgoing detailed description has described only a few of the many possible implementations of the present invention. For this reason, this detailed description is intended by way of illustration, and not by way of limitation. It is only the following claims, including all equivalents that are intended to define the scope of this invention.

The invention claimed is:

1. A method for generating at least one modulator input signal from at least one regulator signal, the method comprising:
    generating at least one dither signal based on the periodic output of elements of a discrete dither sequence of a basic form DF=0, 1, 2, . . . $2^{(m-n)}-1$; and
    adding the at least one dither signal to the regulator signal, wherein the regulator signal comprises a digital regulator signal with a length of m bits, and
    wherein the modulator input signal comprises a digital modulator input signal with a length of n bits, where m>n.

2. The method as claimed in claim 1, further comprising: outputting two synchronized modulator output signals.

3. The method as claimed in claim 2, wherein outputting two synchronized modulator output signals comprises outputting the two synchronized modulator input signals to a modulator output stage in an H-bridge circuit, and generating a common-mode output voltage at one output of the modulator output stage based on the at least one dither signal.

4. The method as claimed in claim 1, further comprising: generating a first modulator input signal by adding the at least one dither signal to a first regulator signal, and generating a second modulator input signal to an inverted second regulator signal.

5. The method as claimed in claim 1, further comprising: adding an integer to the basic form of the discrete dither sequence.

6. The method as claimed in claim 1, further comprising: multiplying the discrete dither sequence in the basic form by an integer other than $2^{(m-n)}/(m-n)$.

7. The method as claimed in claim 1, further comprising: combining the discrete dither sequence in the basic form with at least one further discrete dither sequence in the basic form.

8. The method as claimed in claim 1, further comprising: changing a sequence of the elements of the discrete dither sequence.

9. The method as claimed in claim 8, further comprising: arranging the sequence of the elements toward an optimally high-frequency configuration of the at least one modulator input signal.

10. The method as claimed in claim 1, further comprising: generating modulator input signals using the same dither signal for one of a plurality of channels.

11. The method as claimed in claim 1, further comprising: reading the elements of the discrete dither sequence from a lookup table.

12. The method as claimed in claim 11, wherein reading the elements of the discrete dither sequence comprises reading the elements of the discrete dither sequence from the lookup table as a function of a gradually changing count.

13. The method as claimed in claim 12, further comprising: triggering a change in the count by an external trigger signal.

14. The method as claimed in claim 13, wherein the external trigger signal comprises a compare signal of a modulator connected downstream for detecting a peak of a triangle signal of the modulator, and wherein the modulator input signals are input into said modulator for pulse width modulation.

15. The method as claimed in claim 14, further comprising: changing the count following arrival of each external trigger signal.

16. The method as claimed in claim 15, further comprising: outputting the elements of the discrete dither sequence with a phase shift.

17. The method as claimed in claim 16, wherein the phase shift is of the form $2^{(m-n)}/k$ or $2^{(m-n)}/(2 \cdot k)$, where k is a positive integer.

18. The method as claimed in claim 14, further comprising: changing the count following arrival of a predefined number of external trigger signals.

19. A digital premodulator comprising:
    a counter unit having a trigger that inputs a trigger signal,
    a memory having a recording table, the memory being connected downstream of the counter unit,
    a processing unit including one regulator signal input that is operable to input a regulator signal, two dither signal inputs that are operable to input a respective dither signal, and at least two premodulator outputs that are operable to output a modulator input signal,
    wherein the counter unit is operable to output a count when the trigger signal is input, a value of a dither sequence is read from the recoding table based on the output of the count, a respective dither signal being added to the regulator signal, and
    corresponding modulator input signals being generated from the combination of regulator signal and respective dither signal.

20. The digital premodulator as claimed in claim 19, further comprising a second processing unit is provided for each of a plurality of channels, the separate processing unit being connected to a common memory that is operable to output a common dither signal.

21. The digital premodulator as claimed in claim 20, further comprising a plurality of cooperating premodulator units including a counter unit, memory and processing unit which generate respective modulator input signals.

22. A modulator system comprising:
the digital premodulator as claimed in claim 19; and
a modulator that is connected downstream of the digital premodulator,
wherein the digital premodulator outputs are connected to modulator inputs, and
wherein an output of a triangular generator of the modulator is connected to the trigger signal input of the digital premodulator.

23. A modulator system comprising:
the digital premodulator as claimed in claim 19; and
a modulator that is connected downstream the digital premodulator, the modulator comprising a plurality of phase-shifted triangular generators,
wherein the digital premodulator outputs are connected to modulator inputs, and
wherein outputs of a plurality of the triangular generators of the modulator are connected to the trigger signal input of the digital premodulator.

24. A modulator system comprising:
the digital premodulator as claimed in claim 21; and
a modulator connected downstream of the digital premodulator, the modulator comprising a plurality of triangular generators,
wherein the premodulator outputs, which belong together, are connected to corresponding modulator inputs, and
wherein outputs of the triangular generators of the modulator are connected to a respective trigger signal input of an associated premodulator unit of the digital premodulator.

25. The modulator system as claimed in claim 24, wherein the triangular generators of the modulator are operable in a phase-shifted manner.

26. The modulator system as claimed in claim 25, characterized in that a first switch element and a fourth switch element of the modulator operate with respect to a similar change in an associated modulator input signal, the dither signal comprising two dither signals implemented as push-pull signals.

27. A modulator system comprising:
the digital premodulator as claimed in claim 20; and
a modulator that is connected downstream the digital premodulator,
wherein the premodulator outputs are connected to modulator inputs, and
wherein an output of a triangular generator of the modulator is connected to the trigger signal input of the digital premodulator.

28. The modulator system comprising:
the digital premodulator as claimed in claim 20; and
a modulator that is connected downstream the digital premodulator, the modulator comprising a plurality of phase-shifted triangular generators,
wherein the digital premodulator outputs are connected to modulator inputs, and
wherein outputs of a plurality of the triangular generators of the modulator are connected to the trigger signal input of the digital premodulator.

29. The method as claimed in claim 17, wherein k is a number of modulator output stages connected in series to which the modulator input signals are output.

* * * * *

UNITED STATES PATENT AND TRADEMARK OFFICE
CERTIFICATE OF CORRECTION

PATENT NO.       : 7,498,963 B2
APPLICATION NO.  : 11/784047
DATED            : March 3, 2009
INVENTOR(S)      : Helmut Lenz Page 1 of 1

It is certified that error appears in the above-identified patent and that said Letters Patent is hereby corrected as shown below:

In column 15, claim 23, line 19, after "connected downstream" insert --of--.

In column 15, claim 24, line 32, before "premodulator" insert --digital--.

In column 16, claim 27, line 16, after "connected downstream" insert --of--.

In column 16, claim 28, line 25, after "connected downstream" insert --of--.

Signed and Sealed this

Eleventh Day of August, 2009

David J. Kappos
*Director of the United States Patent and Trademark Office*